United States Patent [19]

Yim et al.

[11] 4,203,126
[45] May 13, 1980

[54] CMOS STRUCTURE AND METHOD UTILIZING RETARDED ELECTRIC FIELD FOR MINIMUM LATCH-UP

[75] Inventors: Ernest W. Yim, Sunnyvale; Paul G. G. VanLoon, San Jose, both of Calif.

[73] Assignee: Siliconix, Inc., Santa Clara, Calif.

[21] Appl. No.: 631,729

[22] Filed: Nov. 13, 1975

[51] Int. Cl.² .................................. H01L 27/02
[52] U.S. Cl. ............................. 357/42; 357/41; 357/44; 357/88; 357/89; 357/90
[58] Field of Search ................... 357/40, 41, 42, 43, 357/44, 88, 89, 90

[56] References Cited

U.S. PATENT DOCUMENTS

| | | | |
|---|---|---|---|
| 3,340,598 | 9/1967 | Hatcher | 357/42 |
| 3,440,503 | 4/1969 | Gallagher | 357/42 |
| 3,712,995 | 1/1973 | Steudel | 357/42 |
| 3,748,545 | 7/1973 | Beale | 357/42 |
| 3,920,481 | 11/1975 | Hu | 357/42 |
| 3,925,120 | 12/1975 | Saida et al. | 357/42 |
| 3,934,399 | 1/1976 | Nishimura | 357/42 |

OTHER PUBLICATIONS

RCA Technical Notes; Non Latching Integrated Circuits by W. J. Dennehy; Feb. 1971, pp. 1 to 4.
Electronics; Getting the Most Out of CMOS Devices for Analog Switching Jobs; by E. Thibodeaux; Dec. 1975, pp. 69–74.
IBM Technical Disclosure Bulletin; by James, vol. 16 No. 6 Nov. 1973, p. 1998.
IBM Technical Disclosure Bulletin; by Antipon, vol. 16 No. 8 Jan. 1974.

*Primary Examiner*—Andrew J. James
*Attorney, Agent, or Firm*—Flehr, Hohbach, Test, Albritton & Herbert

[57] ABSTRACT

CMOS device and method utilizing a retarded electric field for reducing the current gain in the base region of parasitic transistors in the device. A buried layer is utilized in the base region of the parasitic transistor, and the resistivities of the buried layer and substrate are chosen to reduce both NPN and PNP betas and also to reduce the distributed resistance shunting the P+N and N+P junctions, thereby increasing the level of current required to produce latch-up in the device.

6 Claims, 8 Drawing Figures

FIG.—1 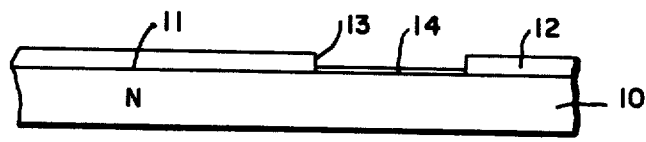
FIG.—2 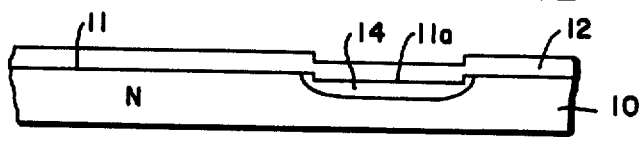
FIG.—3 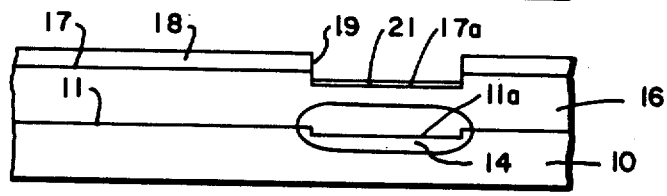
FIG.—4 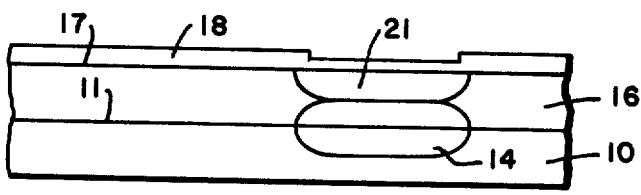
FIG.—5 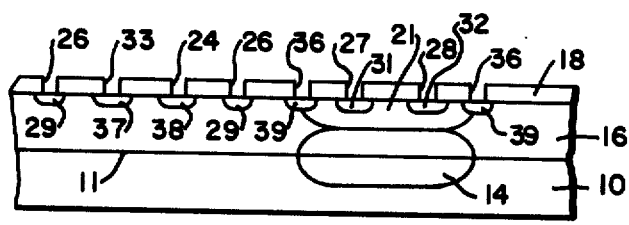
FIG.—6 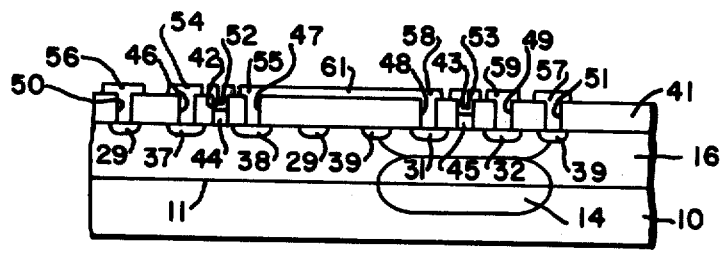
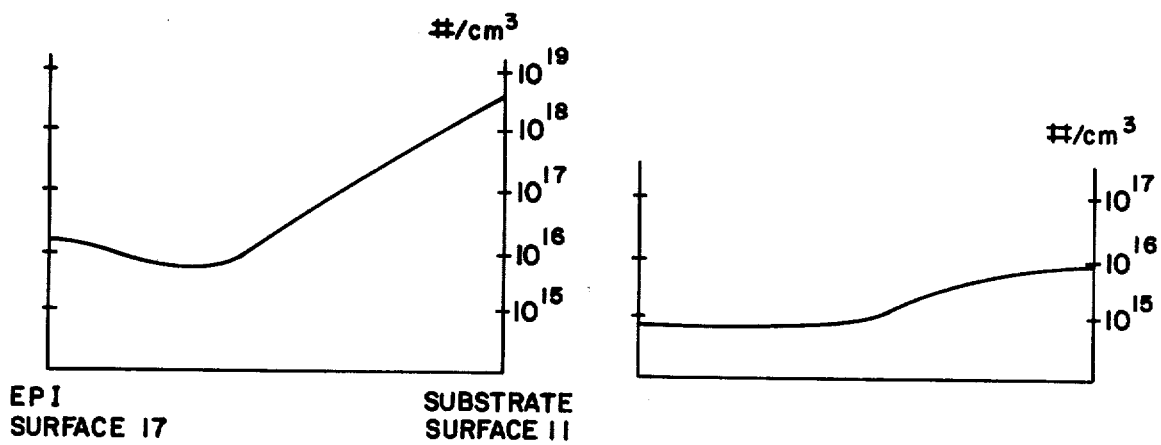
FIG.—7   FIG.—8

CMOS STRUCTURE AND METHOD UTILIZING RETARDED ELECTRIC FIELD FOR MINIMUM LATCH-UP

BACKGROUND OF THE INVENTION

This invention pertains generally to semiconductors and more particularly to complementary semiconductor structures and method of fabricating the same.

Semiconductor devices such as CMOS integrated circuits commonly contain parasitic PNPN structures which can give rise to an undesired SCR action commonly known as "latch-up", wherein the device is turned on by forward biasing of one of the junctions in the PNPN structure. The device remains "on" even after the signal which produced the forward biasing is removed, and this can lead to destruction of the device or metal by excessive current flow.

Heretofore, there have been attempts to eliminate latch-up in such devices by techniques such as turning on power supplies in special sequences, using external components, or avoiding transients. However, there are many applications in which these techniques cannot be employed successfully.

There have also been attempts to eliminate latch-up through fabrication techniques such as the use of dielectric insulation to eliminate parasitic transistors in a CMOS device. Other such techniques have included the use of a sapphire substrate and the reduction of current gain by decreasing minority carrier lifetime in the base by techniques such as gold doping, exposing the CMOS structure to X-ray and gamma ray radiation, and the use of a very deep base with a low current gain and a high minority base transit time. These techniques are subject to a number of problems, including excessive junction leakage, failure to completely eliminate latch-up, low device yield, limited throughput, and high manufacturing cost.

SUMMARY AND OBJECTS OF THE INVENTION

The invention provides a CMOS device and method utilizing a retarded electric field for reducing the current gain in the base region of parasitic transistors in the device. A buried layer is utilized in the base region of the parasitic transistor, and the resistivities of the buried layer and substrate are chosen to reduce both NPN and PNP betas and also to reduce the distributed resistance shunting the P+N and N+P junctions, thereby increasing the level of current required to produce latch-up in the device. In one preferred embodiment, a high conductivity buried P+ boron layer having an impurity concentration on the order of $10^{20}/cm^3$ is deposited on a low resistivity N-type substrate, e.g. 0.7 ohm-cm or less, and diffused at high temperature for a relatively short cycle. An epitaxial layer of N-type material is formed on the surface of the substrate, and boron ions are deposited in the epitaxial layer above the buried layer and diffused to form a well of P-type material. The diffusion is continued until the well and buried layer meet, with the well decreasing in impurity concentration from the surface of the epitaxial layer toward the buried layer, and the buried layer decreasing in impurity concentration from the surface of the substrate, both toward the well of P-type material and toward the back side of the substrate. Thereafter, source and drain regions, control gates and contacts are formed by conventional CMOS techniques.

It is in general an object of the invention to provide a new and improved CMOS semiconductor structure and method of fabricating the same.

Another object of the invention is to provide a CMOS structure and method of the above character wherein the current gain of parasitic transistor is reduced by providing a retarded electric field in the base region of that transistor.

Another object of the invention is to provide a CMOS structure and method of the above character wherein the resistivities of a buried layer and substrate are chosen to reduce both NPN and PNP betas and also to reduce the distributed resistance shunting the P+N and N+P junctions, thereby increasing the level of current required to produce latch-up in the device.

Additional objects and features of the invention will be apparent from the following description in which the preferred embodiments are set forth in detail in conjunction with the accompanying drawings.

BRIEF DESCRIPTION OF THE DRAWINGS

FIGS. 1-6 are cross sectional views illustrating the steps of fabricating a CMOS structure according to the invention.

FIG. 7 is a graphical representation of the impurity concentration in the base region of a vertical NPN parasitic transistor in the CMOS structure of FIG. 6.

FIG. 8 is a graphical representation of the impurity concentration in the base region of a lateral PNP parasitic transistor in the CMOS structure of FIG. 6.

Description of the Preferred Embodiments

In fabricating the semiconductor structure illustrated in FIGS. 1-6, a low resistivity substrate 10 having a generally planar surface 11 is provided. In the preferred embodiment, the substrate is fabricated of silicon having a surface orientation in the (100) crystal plane, and the silicone is doped with a suitable type impurity such as phosphorous, antimony, or arsenic to provide a resistivity on the order of 0.4–0.7 chm-cm. A $SiO_2$ layer 12 is formed on the surface of substrate 10, and a window 13 is formed in the oxide layer by conventional photolithographic techniques to expose a portion of the surface.

A high conductance layer 14 of P+ material is formed on the portion of surface 11 which is exposed through window 13. In the preferred embodiment, the P+ material is boron, and layer 14 is deposited by exposing the surface of the substrate to a boron source. The deposited layer preferably has a resistance on the order of 4–9 ohms, as determined by a conventional 4 point probe technique. Suitable boron sources include BN, $BCl_3$, $BBr_3$, $B_2H_6$ or a spin-on boron compound can be utilized, and the boron layer can be applied by other suitable techniques such as a high or low temperature boron source, ion implantation, or a boron polymer spin-on process.

Once boron layer 14 is formed on substrate 10, it is diffused into the substrate by heating for 1 hour at 1200° C. in a dry $O_2$ atmosphere and thereafter heating for 1 hour at 1200° C. in a wet $O_2$ atmosphere.

During the diffusion of boron layer 14, oxide layer 12 builds up to a thickness on the order of 8,500 Å in the region defined by window 13 and about 10,000 Å elsewhere, thereby forming a step 11a in the surface of substrate 10 above layer 14. As will appear hereinafter, this step is reflected in subsequent layers and serves as a reference for aligning other regions with layer 14.

Following diffusion of boron layer 14, oxide layer 12 is stripped from the substrate, and an epitaxial layer 16 of N− material is formed on the surface of the substrate. In the preferred embodiment, the epitaxial layer has a thickness on the order of 10–13 microns, and it is formed of silicon doped with an N− impurity to provide a resistivity on the order of 5–8 ohm-cm. The epitaxial layer has a generally planar upper surface 17 with a step 17a aligned with step 11a in the surface of the substrate. An $SiO_2$ layer 18 is grown on surface 17, and a window 19 is formed in the oxide layer in alignment with step 17a by suitable photolithographic techniques, thereby exposing a portion of the surface of the epitaxial layer.

A layer 21 of P-type material is deposited on the exposed portion of epitaxial layer 16. In the preferred embodiment, the P-type material is boron, and layer 21 is formed by ion implantation to provide a dosage on the order of $2 \times 10^{13}/cm^2$. Thereafter, boron region 21 is diffused at a temperature on the order of 1200° C. for two hours in a dry $O_2$ atmosphere. As region 21 is diffused downwardly into epitaxial layer 16, layer 14 is being diffused farther down into substrate 10 and also upwardly into epitaxial layer 16. The diffusion is allowed to continue until layers 14 and 21 meet, as illustrated in FIG. 4.

Substrate 10 and epitaxial layer 16 form the body of the semiconductor structure, layer 14 constitutes a buried layer, and layer 21 forms a P-type well which extends to the surface 17 of the epitaxial layer. If desired, the P-type material of which layer 21 is formed can be deposited on the surface of the epitaxial layer by other suitable techniques, including those discussed above in conjunction with the formation of layer 14.

FIG. 7 illustrates the impurity concentration profile of P-type well 21 and buried layer 14 between the surface of the epitaxial layer and the surface of substrate 10. As illustrated, the P-type well has a concentration on the order of $2 \times 10^{16}/cm^3$ at surface 17 which decreases to about $8 \times 10^{15}/cm$ near the buried layer. The buried layer has a concentration on the order of $5 \times 10^{18}/cm^3$ at the surface of the substrate and decreases to about $8 \times 10^{15} cm/^3$ toward the lower portion of the well. Although not illustrated in FIG. 7, the impurity concentration of the buried layer also decreases to a level on the order of $8 \times 10^{15}/cm^3$ toward the back side of the substrate, i.e. the side opposite to surface 11.

During the diffusion step, oxide layer 18 regrows in window 19 so that the entire surface of the epitaxial layer is covered. Thereafter, windows 26, 27 and 28 are formed in the oxide layer by conventional photolithographic techniques, with window 26 being an annular window which exposes a portion of the surface of epitaxial layer 16 outside P-well 21. Windows 27 and 28 expose portions of the surface above the P-well. An N+ material such as phosphorous is deposited on the exposed portions of the surface and diffused into the epitaxial layer to form a guard ring or isolation region 29 for a P-channel field effect transistor (FET) and source and drain regions 31, 32 for an N−channel FET.

During the diffusion of the P-material, oxide regrows in windows 26–28, and the entire surface of the epitaxial layer is again covered. Thereafter, windows 33, 34 and 36 are formed photolithographically, with windows 33, 34 exposing portions of the surface of the epitaxial layer outside P-well 21. Window 36 is an annular window which exposes the surface at the junction of the P-well and the epitaxial layer. A P+ material such as boron is deposited on the exposed portions of the surfaces and diffused into the epitaxial layer to form source and drain regions 37, 38 for the P-channel FET and a guard ring or isolation region 39 for the N-channel FET.

Following diffusion of the P-type material, oxide layer 18 is stripped away, and a oxide layer 41 is formed on surface 17. After oxide layer 41 is grown, openings 42, 43 are etched through layer 41 to surface 17, and gate oxide regions 44, 45 are grown in openings 42, 43 to a thickness on the order of 2,000 A. Alternatively, the gate oxide regions can be formed by etching oxide layer 41 to a thickness on the order of 2,000 A in the desired regions. Contact openings 46–49 are formed in the oxide layer 41 and extend to the source and drain regions, and additional contact openings 50, 51 extend through the oxide layer to the body. A suitable metal such as aluminum is deposited on the surface of oxide layer 41, gate oxide regions 44, 45 and in contact openings 46–51 by a suitable technique, such as evaporation, to form gate electrodes 52, 53 and contacts 54, 55, 56 and 57, 58, 59 for the source, drain and body regions of the P-channel and N-channel devices. The deposited metal is then selectively etched from the surface of the oxide layer to form a desired lead pattern 61, and the metal is alloyed to provide good contact with the source and drain regions.

In operation and use, the device is substantially free of parasitic SCR action or latch-up. In conventional CMOS devices the problem is mainly due to a vertical NPN transistor and a lateral PNP transistor which form a parasitic SCR. The NPN transistor is formed by either the N-type drain or source region which serves as an emitter, the P-well which serves as a base, and the body or substrate which serves as a collector. In the lateral PNP transistor, the P-type source or drain region serves as an emitter, the substrate or body serves as a base, and the P-well acts as a collector.

In the CMOS device of the invention, buried layer 14 and P-well 21 form a retarded electric field in the base region of the vertical NPN parasitic transistor, as can be seen from FIG. 7. This retarded field reduces the forward current gain of the parasitic NPN transistor from a value on the order of 100–1000 to a value on the order of 1–10. The current gain of the PNP transistor is similarly reduced, as can be seen from FIG. 8 which illustrates the impurity concentration profile in the base region of this transistor. In addition, the resistivities of the substrate and buried layer 14 reduce the distributed resistance shunting the P+N and N+P junctions. As noted above, these are the junctions which primarily control the unwanted SCR action, and the low resistance requires a substantially higher current level to produce latch-up.

The invention has a number of important features and advantages. As pointed out above, it substantially eliminates the problem of parasitic latch-up in CMOS devices. The device can be manufactured at relatively low cost, with high throughput and high yield. The use of a low temperature (e.g. 800°–900° C.) thin epitaxial film process makes it possible to produce improved CMOS circuits with a more abrupt Boron concentration. With larger wafers (e.g. 3–4 inch diameter), this low temperature process has the additional advantage of eliminating the problem of warpage produced by high temperature diffusion. To further minimize out-diffusion, mask alignment can be accomplished by a silicon etching process, rather than an oxide growth step.

It is apparent from the foregoing that a new and improved CMOS structure and method of fabricating the same have been provided. While only the presently preferred embodiments have been described herein, as will be apparent to those familiar with the art, certain changes and modifications can be made without departing from the scope of the invention as defined by the following claims.

What is claimed is:

1. In a semiconductor structure: a semiconductor body of first conductivity type having a generally planar surface, a buried layer of second conductivity type within the body, a well of material of the second conductivity type extending from the surface of the body to the buried layer, first and second regions of the first conductivity type formed in the well and extending to the surface, first and second regions of the second conductivity type formed in the body outside the well and extending to the surface, a layer of insulating material overlying the surface, and contacts extending through openings in the insulating layer to the regions formed in the well and body, said well and said buried layer having impurity concentrations which decrease toward the common boundary thereof to form a region of retarded electric field in the base region of a parasitic transistor formed by one of the regions of the first conductivity type, the well and the semiconductor body, said retarded field reducing the current gain of the parasitic transistor and thereby preventing undesired SCR action in the transistor.

2. The semiconductor structure of claim 1 wherein the material of the well has an impurity concentration ranging from about $2 \times 10^{16}/cm^3$ near the surface to about $8 \times 10^{15}/cm^3$ toward the buried layer.

3. The semiconductor structure of claim 1 wherein the buried layer is formed of boron having a concentration on the order of $5 \times 10^{18}/cm^3$ a predetermined distance below the well and a concentration on the order of $8 \times 10^{15}/cm^3$ toward the well.

4. The semiconductor structure of claim 1 wherein the body has a resistivity no greater than about 0.7 ohm-cm.

5. The semiconductor structure of claim 1 wherein the regions of first conductivity type formed in the well constitute the source and drain of a first field effect transistor (FET) and the regions formed in the body outside the well constitute the source and drain of a second FET complementary to the first FET.

6. In a CMOS field effect transistor structure: a body of N-type semiconductor material having a generally planar surface and a resistivity no greater than about 0.7 ohm-cm, a buried layer of P-type material formed within the body below the surface and having an impurity concentration ranging from about $5 \times 10^{18}/cm^3$ toward the surface to about $8 \times 10^{15}/cm^3$ away from the surface, a well of P-type material extending from the surface to the buried layer and having an impurity concentration ranging from about $2 \times 10^{16}/cm^3$ near the surface to about $8 \times 10^{15}/cm^3$ a few microns from the surface and to about $10^{18}/cm^3$ at the buried layer, source and drain regions formed of N-type material formed in the well and extending to the surface, source and drain regions of P-type material formed in the body outside the well and extending to the surface, a layer of insulating material overlying the source and drain regions, and gate electrodes overlying the source and drain regions and spaced therefrom by the layer of insulating material, said well and said buried layer forming a region of retarded electric field in the base region of a parasitic transistor formed by the N-type source or drain region, the P-type well and the N-type body, the retarded field serving to reduce the current gain of the parasitic transistor and thereby prevent undesired SCR action in said transistor.

* * * * *